United States Patent [19]

Anderson

[11] Patent Number: 4,691,483
[45] Date of Patent: Sep. 8, 1987

[54] SHELTER

[75] Inventor: Thomas L. Anderson, Nashua, N.H.

[73] Assignee: Craig Systems Corporation, Amesbury, Mass.

[21] Appl. No.: 688,017

[22] Filed: Dec. 31, 1984

[51] Int. Cl.⁴ .......................... E04H 9/00; H05K 9/00
[52] U.S. Cl. ...................................... 52/79.1; 49/400; 52/210; 174/35 MS
[58] Field of Search .................... 52/79.1–79.5, 52/79.9, 280, 741, 745, 210; 174/35 GC, 35 MS; 49/400, 401

[56] References Cited

U.S. PATENT DOCUMENTS

| | | | |
|---|---|---|---|
| 2,925,457 | 2/1960 | Lindgren | 174/35 MS |
| 3,055,969 | 9/1962 | Schaller, Jr. | 174/35 MS |
| 3,129,278 | 4/1964 | Watt, Jr. et al. | 174/35 MS |
| 3,198,297 | 8/1965 | Halle | 49/504 |
| 3,218,678 | 11/1965 | Russell | 49/489 |
| 3,322,879 | 5/1967 | Lindgren | 174/35 MS |
| 3,350,497 | 10/1967 | Weaver, Jr. et al. | 174/35 MS |
| 3,364,298 | 1/1968 | Peters | 174/35 MS |
| 3,382,625 | 5/1968 | Kuss | 52/79.1 |
| 3,546,359 | 12/1970 | Ciccarelli | 174/35 MS |
| 3,580,981 | 5/1971 | Lamp | 174/35 MS |
| 3,584,134 | 6/1971 | Nichols | 174/35 MS |
| 3,589,070 | 6/1971 | Hansen | 174/35 MS |
| 3,709,733 | 1/1973 | Mautner | 52/787 |
| 3,946,528 | 3/1976 | Jacobsen et al. | 52/79.9 |
| 3,968,989 | 7/1976 | Schippers | 52/280 |
| 4,370,831 | 2/1983 | Hamilton | 174/35 MS |
| 4,381,632 | 5/1983 | Geitner | 52/262 |

FOREIGN PATENT DOCUMENTS 431895  9/1967  Switzerland .................. 49/401

OTHER PUBLICATIONS

Metex Corporation, "Omni-Cell Shielded Ventilating Panels", 1969, 1 page, class 174/35 MS.

Primary Examiner—John E. Murtagh
Assistant Examiner—Andrew Joseph Rudy
Attorney, Agent, or Firm—Pahl, Lorusso & Loud

[57] ABSTRACT

In the electronic equipment shelter disclosed herein, protection of electronic equipment from both normal and abnormal environmental conditions, including severe electromagnetic pulses, is provided by employing a construction in which panels having inner and outer aluminum skins are joined together in an assembly employing extruded box tubes at each edge with the outer skins being welded to each other and to the tubes so that a complete conductive envelope is obtained. The necessary door opening is made electromagnetically unitary with the main shelter body by metal spring finger gaskets which are compressed by means of a multiplicity of linked dogging assemblies all around the door frame.

6 Claims, 7 Drawing Figures

SHELTER

BACKGROUND OF THE INVENTION

The present invention relates to military shelters and more particularly to military shelters of the type which are intended to protect electronic equipment from both normal and abnormal environmental conditions, including severe electromagnetic pulses.

It has previously been known to provide, for military applications, lightweight shelters for protecting and transporting, as a unit, electronic communication systems. Typically, such prior art shelters have comprised panels of the sandwich type which employ inner and outer aluminum skins separated by a lightweight and insulating spacing material, e.g. a foamed plastic or a paper-like honeycomb material. Such panels were typically attached to an aluminum framework using rivets, e.g. of the so-called pop rivet type. The resultant structure, because of the inherently conductive nature of the elements employed, typically provided a degree of electromagnetic shielding, i.e. a form of shielding which would be sufficient to prevent spurious electromagnetic radiations from the equipment installed within the shelter.

Increasingly, however, the military has become concerned with the ability of electronic communications equipment, particularly remote radio relay systems, to withstand the severe electromagnetic pulse which accompanies the high altitude detonation of a nuclear device. As is understood by those skilled in the art, interference with and damage to electronic semiconductor devices can occur, not only from the radiation which accompanies a nuclear explosion, but also from the electromagnetic pulse which is generated by such an event. Induced currents created within the circuits themselves by the electromagnetic wave may, in fact, burn out and destroy a semiconductor device.

In general, prior art shelters have not been deemed in any way satisfactory to prevent this latter kind of damage. At the frequencies of interest, e.g. 200 KHz to 10 GHz, such prior art shelters provide only about 60 db of attenuation of electromagnetic waves. Test results of the present invention indicate a yield of 100 dB of attenuation over this frequency range.

Among the several objects of the present invention may be noted the provision of a novel shelter for protecting electronic equipment from both normal and abnormal environmental conditions, including severe electromagnetic pulses; the provision of such a shelter which can provide electromagnetic wave attenuation in the order of 100 db; the provision of such a shelter which is relatively lightweight and easily transportable; the provision of such a shelter which provides relatively normal ingress and egress capability to permit servicing and operation of electronic equipment therein; the provision of such a shelter which allows adequate ventilation to support personnel working within the shelter; the provision of such a shelter which is relatively easily fabricated and which is of relatively simple and inexpensive construction. Other objects and features will be in part apparent and in part pointed out hereinafter.

SUMMARY OF THE INVENTION

Briefly, a shelter according to the present invention is constructed using wall panels and roof and floor panels each comprising inner and outer aluminum skin sheets with an insulating spacing material adhesively bonded therebetween. In assembling these panels, an extruded aluminum tube of rectangular cross-section is provided along each line of intersection of a pair of the panels, the outer skins of the adjacent panels being extended substantially beyond the spacing material and being welded to each other and to the tube thereby to form a substantially continuous and conductive outer skin for the shelter. A rectangular door opening frame is set into one side panel, the frame comprising, along all four sides, an aluminum extrusion having a box section over which the inner and outer skin of the panel extend and to which the skins are welded. Hinged to the door opening frame by means of a hinge mechanism providing some lost motion is a door comprising a door panel having inner and outer aluminum skins with an insulating spacer material adhesively bonded therebetween, the door panel being set into an enclosing peripheral frame comprising, along all four sides, an extrusion having a box section over which the inner and outer skins of the door panel extend and to which those skins are welded.

Extending around the door opening frame and the door peripheral frame are first and second metal spring finger strips for establishing respective conductive lines between the door opening frame and the peripheral frame. Also, extending around the door perimeter are two additional gaskets which make intimate contact to the door opening upon closure. These gaskets are a wire mesh gasket for shielding and a silicone gasket for weather protection. Mounted at a plurality of spaced points around the door opening frame are a succession of locking ramps. A corresponding plurality of pivotally mounted roller dogs are mounted on the door itself and adapted to engage the ramps. The dog elements are coupled to each other in sets by suitable linkage means to enable simultaneous operation to engage the respective ramps and to pull the door into intimate conductive engagement with the door opening frame, compressing the spring finger strips. In this way, a conductively unitaly envelope is formed for protecting electronic equipment within the shelter.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
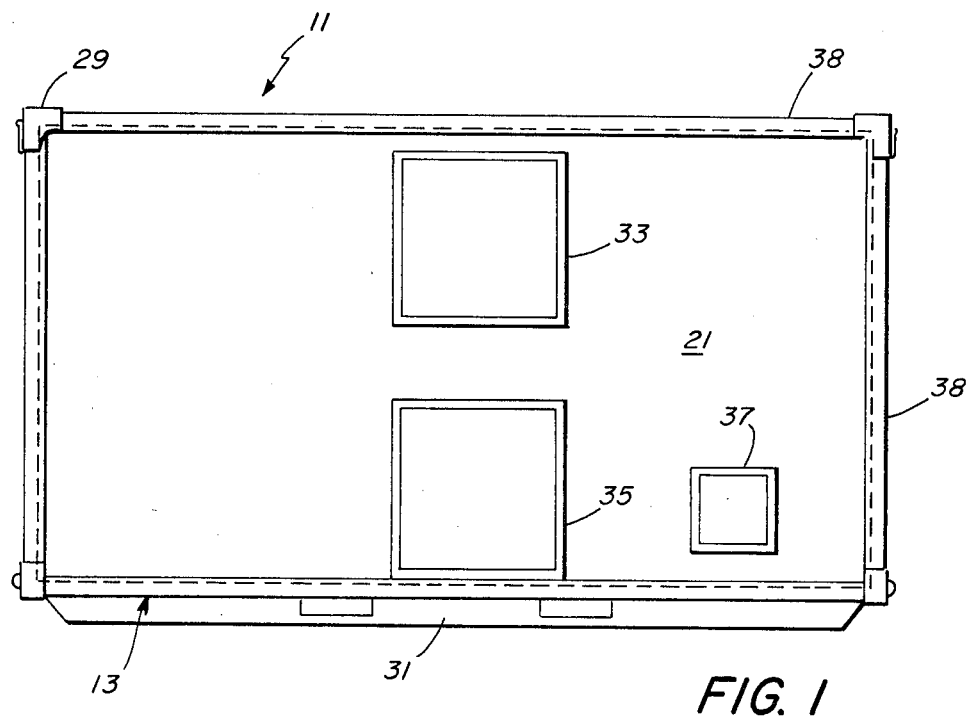
FIG. 1 is a side view of a lightweight military shelter constructed in accordance with the present invention.
Figure 2:
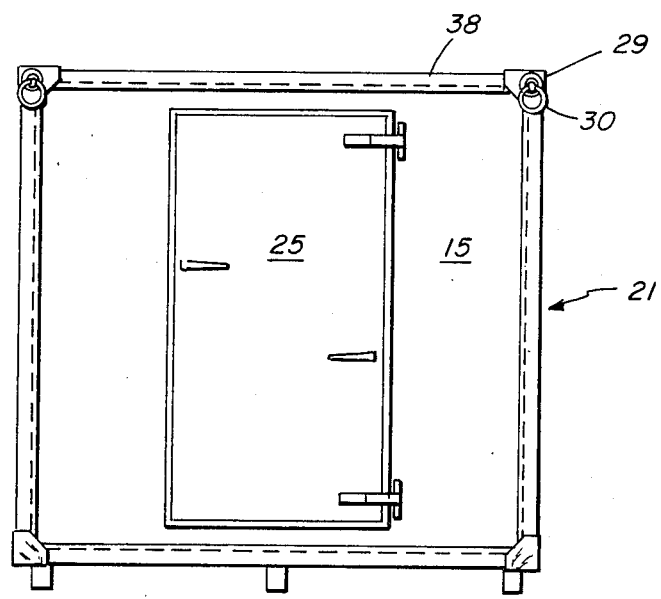
FIG. 2 is an end view fthe shelter of FIG. 1.

Referring now to FIGS. 1 and 2, it may be seen that the military shelter illustrated is generally in the form of a right parallelpiped, i.e. it is of generally rectangular section. The shelter comprises top and bottom panels 11 and 13, respectively, end panels 15 and 17, and side panels 21 and 23. As may be seen, one end wall 15 is provided with an openable door 25 set into a doorway within the end panel. Set into one of the side walls 21 are a pair of vent assemblies 33 and 35 and an electrical connector panel 37.

While the construction of the joints between the panels is described in greater detail herein, it may be noted that these joints are further protected by trim angles 38, i.e. aluminum extrusions, which are adhesively bonded along the straight edges between panels. Similarly, corner fittings 29 with lifting and towing eyes 30 are fitted at each corner of the shelter to both protect the shelter and facilitate its handling. As is conventional, skids 31 are provided under the floor to facilitate movement of the overall shelter for short distances without the use of the usual transporter or dolly set.

Each of the panels is of generally similar construction, as described in greater detail hereinafter. Each panel comprises a sandwich construction of inner and outer skins with an insulating spacing material adhesively bonded between the inner and outer skins. The embodiment illustrated was constructed using conventional foamed plastic for the spacer material though honeycomb spacer material may also be used in certain applications.

Figure 3:
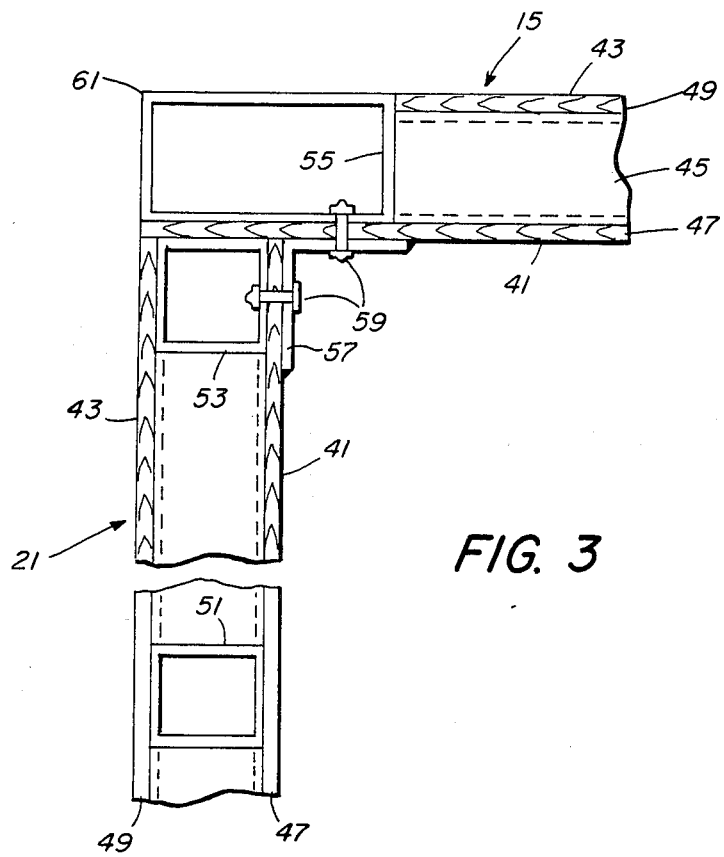
FIG. 3 is a cross-sectional view showing the juncture between a pair of side panels employed in the shelter of FIG. 1.

The basic construction of the individual panels may best be seen in FIG. 3 which also serves to illustrate the construction at the line of juncture between panels. As indicated previously, each panel, e.g. the panels 21 and 15 comprises an aluminum inner skin 41 and an aluminum outer skin 43. Skins 41 and 43 are adhesively assembled in a sandwich structure with insulating spacer material between the skins. In the embodiment illustrated, the spacing is made up of three components, a foamed plastic resin 45 with a wood interface panel 47 and 49 on either side, i.e. adjacent the aluminum skins. Depending upon the loading expected to be imposed upon the panel, aluminum ribs 51 of rectangular extruded tubular form may be located in place of the honeycomb 45 at various spacings. Typically, such a rib is provided at the periphery of the foam material, as indicated at 53, to act as the panel margin. The ribs 51 and 53 are adhesively bonded in place, i.e. between the wood facings 47 and 49, as is conventional in the art.

In accordance with the practice of the present invention, an aluminum box beam of rectangular cross-section, designated by reference character 55 in FIG. 3, is provided at each line of intersection between the panels which make up the shelter. Further, the outer aluminum skin 43 of each panel is extended beyond the intermediate insulating spacer materials so as to overlie the corner beam 55. To facilitate the initial assembly of the panels with the corner beam 55, an internal trim angle 57 is riveted to each of the panels to join them together at the corner, this riveting being indicated at 59 in FIG. 3. Preferably, to maximize the conductive union of the inner aluminum skins, the outer surfaces of the inner trim angle and the corresponding facing strips of the inner skins are metallized by a hot tin spray prior to riveting.

With the panels thereby held in place, the outer skins 43 are then welded to each other and to the corner beam 55 as indicated by reference character 61. Preferably, this welded seam is not ground down but rather is left wholly intact to provide a joint of maximum conductivity, the protective outer trim angle 38 being adhesively bonded over this welded joint as mentioned previously.

To facilitate tight closure of the door by the dog mechanism described hereinafter, the door is supported by hinge mechanisms which provide an appropriate amount of lost motion, i.e. a "floating" type hinge.

Figure 4:
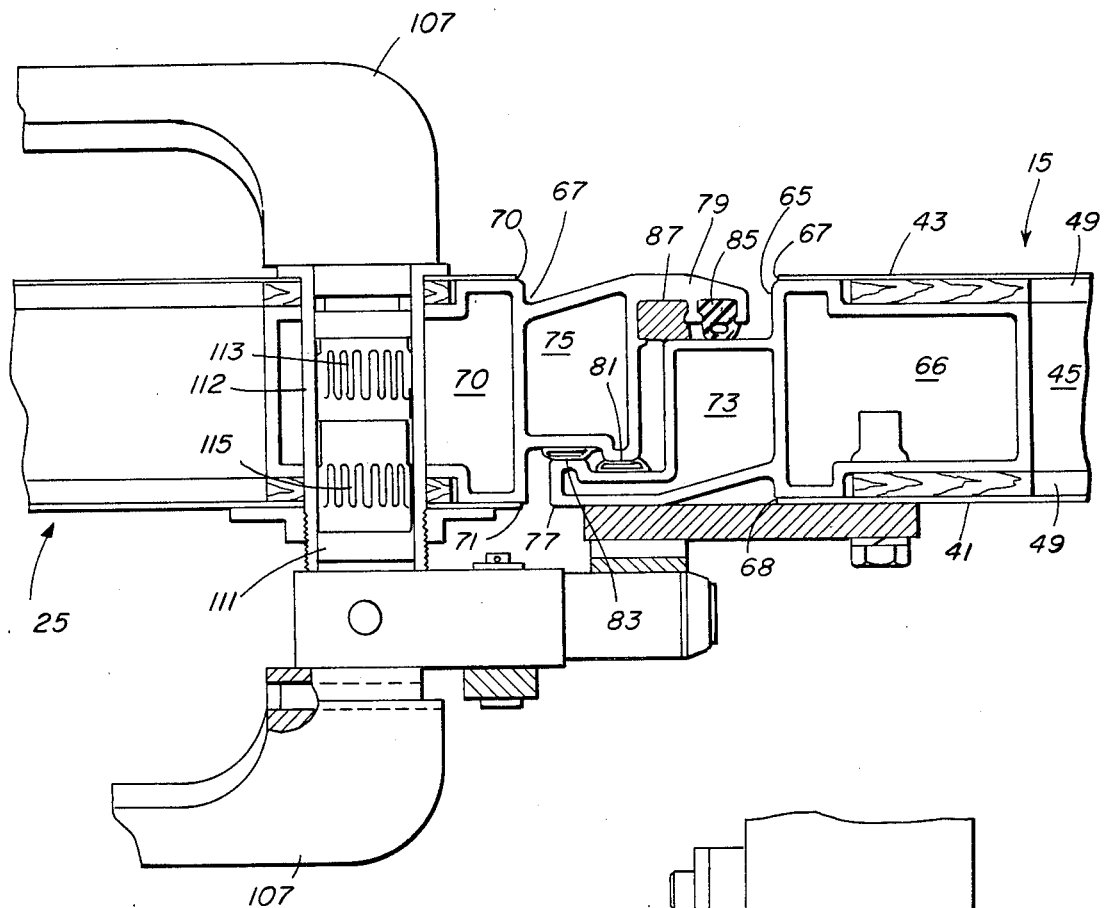
FIG. 4 is a cross-sectional view showing the construction of a door and door frame employed in the shelter of FIG. 1.
Figure 5:
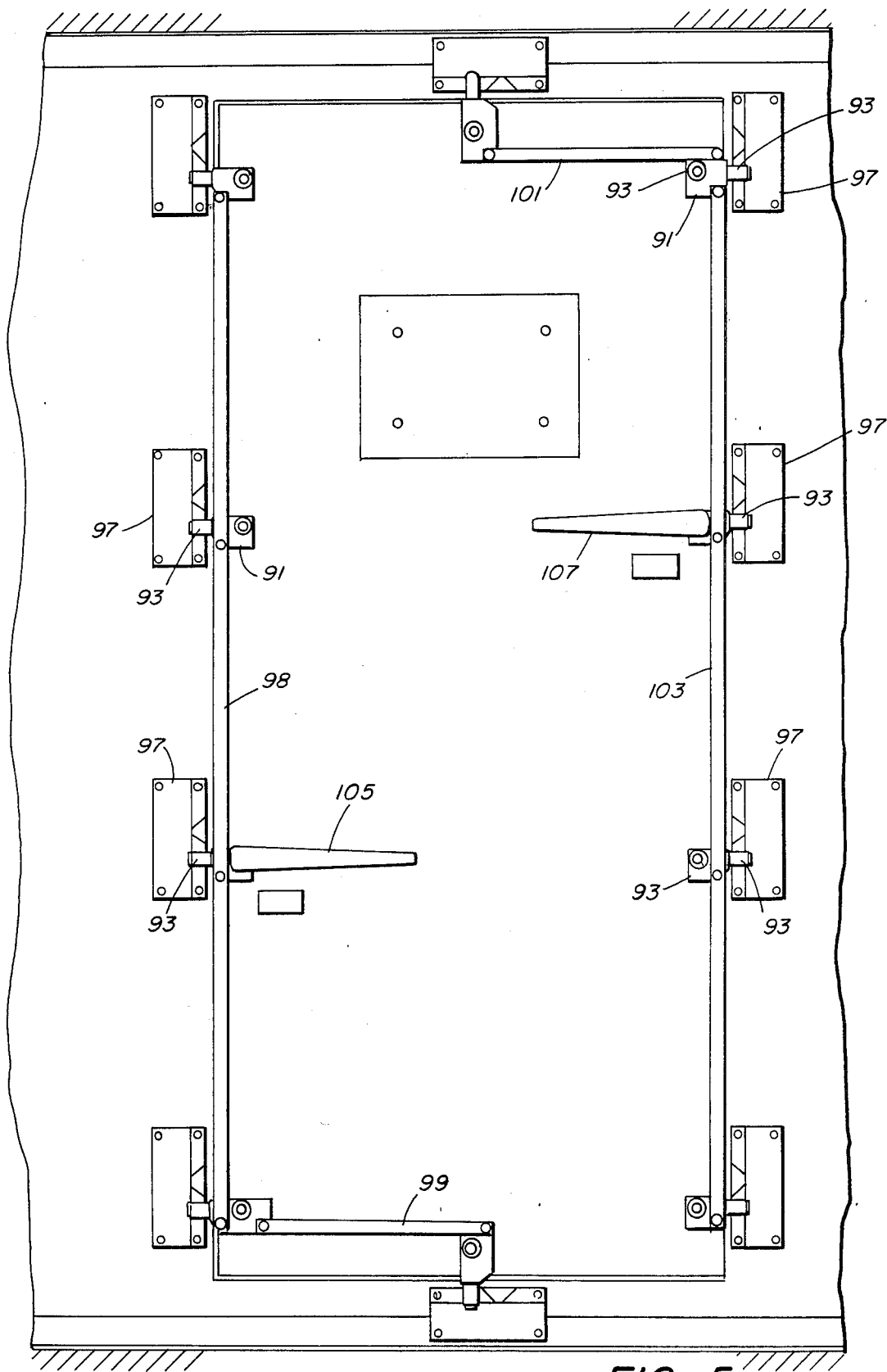
FIG. 5 is a plan view of the shelter door, viewed from the inside, showing the system of dogs employed for sealing the door into the door frame.

As may best be seen in FIGS. 4 and 5, the door, designated generally by reference character 25, is received into a door opening frame formed using a specially shaped aluminum extrusion 65 which is set into the shelter end panel 15. The shape of extrusion 65 mates with or complements an extrusion 67 which is used to form a door enclosing peripheral frame which is part of the door 25 itself. The door opening extrusion 65 includes a first box section 66 which is of stepped width as illustrated and which fits between the inner and outer skins of the panel 15. As may be seen, the insulating spacing material is cut back in steps, the plastic foam being cut back the deepest with the wood facings 47 and 49 being cut back a lesser amount.

In any event, the inner and outer skins 41 and 43 extend over the box section 66 and the edges thereof of the skins are welded to the box section as indicated at 67 and 68. An essentially similar construction is provided for the door itself, the extrusion 67 including a box section 70 which is recessed into the door panel 25 with the inner and outer skins of the door panel extending over the box section and being welded thereto as indicted at 70 and 71.

While the door frame and door margin extrusions 65 and 67 respectively are not identical, they are of similar cross-section in that each comprises a second box section, 73 and 75 respectively, carrying projecting lip portions, 77 and 79 respectively. The door opening extrusion 65 and the door periphery extrusion 67 each carry elongate strips of metal finger stock, designated by reference characters 81 and 83, respectively. These finger stock strips provide conductive gasketting around the door interface. As is understood, such finger stock is available commercially and typically comprises an elongate strip of beryllium copper spring stock cut into a multiplicity of fingers which form individual contacts when deflected from their normal arcuate configuration. The lip portion 79 on the door periphery extrusion also carries a synthetic rubber weather gasket 85 and a conductive mesh gasket 87. Mesh gasket 87 is of a conventional construction comprising a wire braid mesh around a spongy neoprene or silicone core and operates to provide shielding of higher frequency electromagnetic components. Being spaced apart as illustrated, the mesh gasket and the finger stock strips acting together provide superior attenuation of low frequency magnetic pulse energy.

To close the door and compress the various conductive and weather-sealing gaskets, the door is provided with a ten-point latch system as may be best seen in FIG. 5, together with FIG. 4. As may be seen in FIG. 5, ten roller latches 91 are mounted around the periphery of the door on respective bolts 93. Each of the latches 91 carries a roller 95 with a separate tapered nose piece 96 which together act as a dog in cooperation with a ramp-like keeper assembly 97. The latches along one side and on the bottom are coupled by link rods 98 and 99 while the latches on the other side and the top are coupled by link rods 101 and 103, respective handles 105 and 107 being provided for operating each set of roller latches in substantial synchronism.

Figure 6:
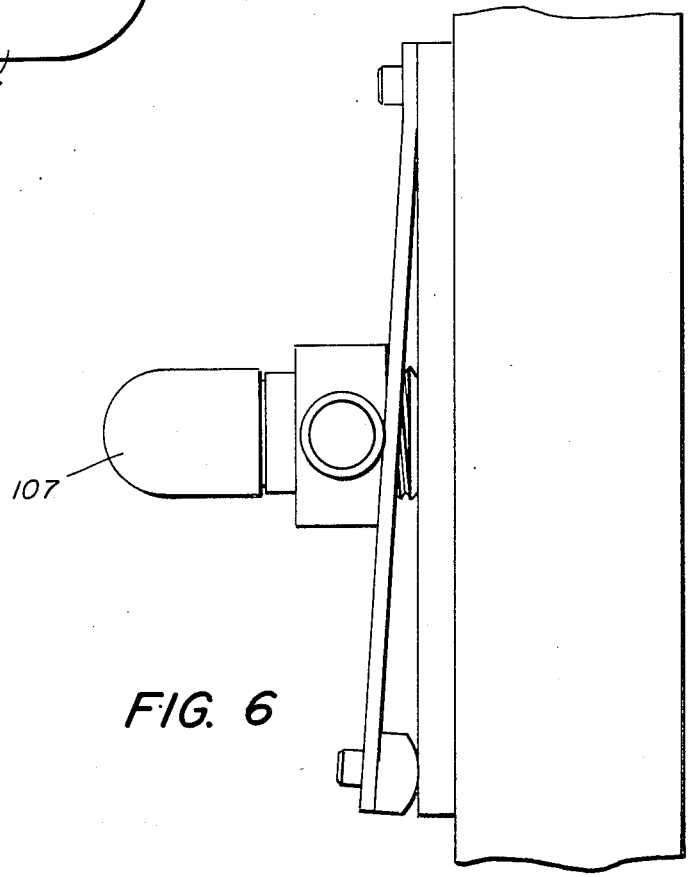
FIG. 6 shows the door frame ramps which cooperate with the individual door dog elements.

As may best be seen in FIG. 6, the keeper assemblies 97 provide a ramp-like surface 107 which, when engaged by the respective latch roller 95, cause the door to be cammed into tight intimate engagement with the door frame, thereby compressing the interposed gaskets and seals, the lost motion provided by the floating hinges allowing this compression.

As may be seen in FIGS. 4 and 5, handles are provided on both sides of the door, being linked by a shaft 111 which passes through a bushing 112 extending through the door margin extrusion 67. Preferably, the handles are well grounded to the extrusion by the means of two conductive annular finger stock gaskets, as indicated at 113 and 115, around the shaft 111.

To permit air to be circulated through its interior, the shelter of the present invention incorporates vents which are constructed to permit air flow while blocking or filtering electromagnetic energy. As is understood, such filtering can be provided by means of a metal honeycomb, i.e. convoluted brass strips soldered together to form a highly conductive matrix. The filters employed in the present shelter are of such construction and are joined to the side wall panels in a manner which maintains the conductive envelope, the techniques being somewhat similar to those used at the corners and door of the shelter. An alternative way of constructing such a vent is by using convoluted aluminum strips which are conductively joined by clip brazing.

Figure 7:
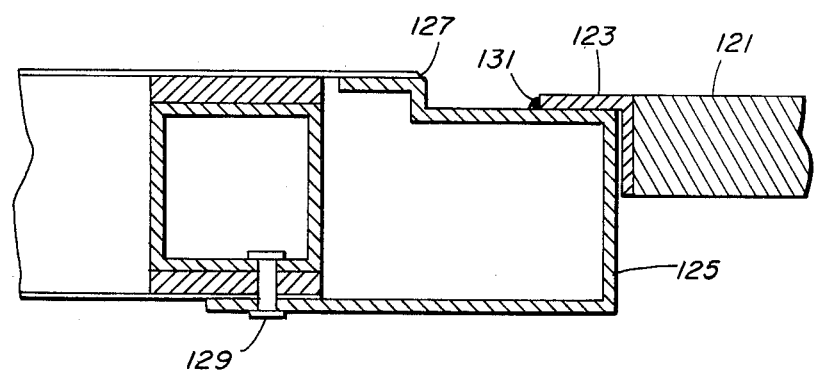
FIG. 7 is a cross-sectional view showing the construction of a vent assembly employed in the shelter of FIG. 1.

With reference to FIG. 7, the brass honeycomb material, designated generally by reference character 121, is assembled and mounted within a brass metal frame 123. To permit mounting of the vent, an aluminum extrusion 125 is configured in a frame for the grill. As with the corners and door margin, the outer skin of the adjacent sandwich panel is extended well beyond the insulating interior spacing material so that it overlaps the frame extrusion and is welded thereto, as indicated at 127. The extrusion 125 is roughly U-shaped and the interior is through-riveted to a panel rib 51, as indicated at 129. Again, locally metallized faces, e.g. by hot spraying tin, are preferably provided on the facing surfaces of the inner panels' skin 41 and the mating inner surface of the extrusion 125 adjacent the line of rivets 129.

To facilitate the mounting of the brass vent rim 123 into the extrusion, the adjacent surface of the frame is first copper plated. As an alternative to copper plating, a copper spray metalizing may be used. After such surface treatment the brass frame 123 may be relatively simply soldered to the extrusion, e.g. as indicated at 131 in FIG. 7. While the exact construction of the connector panel 37 will vary depending upon the particular application, a construction similar to the vent is preferably used to maximize shielding.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A lightweight shelter for protecting electronic equipment from normal and abnormal environmental conditions including severe electromagnetic pulses, said shelter comprising:

wall panels and roof and floor panels each comprising inner and outer aluminum skin sheets with an insulating spacing material adhesively bonded therebetween;

along each line of intersection of a pair of side panels, an extruded aluminum tube of rectangular cross-section, the outer skins of the adjacent panels being extended substantially beyond the spacing material and being welded to each other and said tube thereby to form a substantially continuous conductive outer skin for said shelter;

in one side panel, a rectangular door opening frame comprising, along all four sides, an extrusion over which said inner and outr skins extend and to which said skins are welded;

hinged to said frame, a door comprising a door panel comprising inner and outer aluminum skins with an insulating spacer material adhesively bonded therebetween and a peripheral frame comprising, along all four sides, an extrusion over which the inner and outer skins of said door panel extend and to which said skins are welded, wherein said door opening extrusion and said door panel extrusion each include a box section which extend into a projecting lip portion, such that said door opening projecting lip portion is positioned relative to said door panel box section when said door is received into said frame, wherein said door opening projecting lip portion carries at least one peripherally mounted spring metal finger strip and said door panel box section carries at least one peripherally mounted spring metal finger strip which together provide at least two lines of conductive gasketing between said door opening frame and said door peripheral frame, when said door is received into said frame;

at least one weather gasket carried along the periphery of said door panel projecting lip portion which protects said at least one door opening projecting lip metal finger strip and said at least one door panel box section metal finger strip from ambient weather conditions when said door is received in said frame;

mounted at a plurality of spaced points around said door opening frame, a succession of locking ramps;

pivotally mounted at a plurality of spaced points around said door peripheral frame, a corresponding plurality of dogs adapted to engage said ramps; and link means coupling said dogs to each other in sets for coordinated operation to engage said ramps and pull said door into intimate conductive engagement with said door opening frame, compressing said spring finger strips.

2. A shelter as set forth in claim 1 further comprising a wire mesh gasket which extends along said door panel projecting lip portion, said wire mesh gasket providing a line of conductive contact which is spaced from the lines of contact formed by said spring finger strips.

3. A shelter as set forth in claim 1 wherein said insulating spacing material comprises a foamed plastic resin.

4. A shelter as set forth in claim 3 wherein each of said panels additionally comprises an intermediate wood layer between each aluminum skin sheet and said honeycomb material.

5. A lightweight shelter for protecting electronic equipment from normal and abnormal environmental conditions including severe electromagnetic pulses, said shelter comprising:

wall panels and roof and floor panels each comprising inner and outer aluminum skin sheets with an insulating spacing material adhesively bonded therebetween;

along each line of intersection of a pair of side panels, an extruded aluminum tube of rectangular cross-section, the outer skins of the adjacent panels being extended substantially beyond the spacing material and being welded to each other and said tube thereby to form a substantially continuous conductive outer skin for said shelter;

in one side panel, a rectangular door opening frame comprising, along all four sides, an extrusion having a box section over which said inner and outer skins extend and to which said skins are welded;

hinged to said frame by a hinge mechanism providing lost motion, a door comprising a door panel comprising inner and outer aluminum skins with an insulating spacer material adhesively bonded therebetween and a peripheral frame comprising, along all four sides, an extrusion having a box section over which the inner and outer skins of said door panel extend and to which said skins are welded, wherein said door opening extrusion and said door panel extrusion each include a box section which extend into a projecting lip portion, such that said door opening projecting lip portion is positioned relative to said door panel box section when said door is received into said frame, wherein said door opening projecting lip portion carries at least one peripherally mounted spring metal finger strip and said door panel box section carries at least one peripherally mounted spring metal finger strip which together provide at least two lines of conductive gasketing between said door opening frame and said door peripheral frame, when said door is received into said frame;

at least one weather gasket carried along the periphery of said door panel projecting lip portion which protects said at least one door opening projecting lip metal finger strip and said at least one door panel box section metal finger strip from ambient weather conditions when said door is received in said frame;

mounted at a plurality of spaced points around said door opening frame, a succession of locking ramps;

pivotally mounted at a plurality of spaced points around said door peripheral frame, a corresponding plurality of roller dogs adapted to engage said ramps; and link means coupling said dogs to each other in sets for coordinated operation to engage said ramps and pull said door into intimate conductive engagement with said door opening frame, compressing said spring finger strips.

6. A lightweight shelter for protecting electronic equipment from normal and abnormal environmental conditions including severe electromagnetic pulses, said shelter comprising:

wall panels and roof and floor panels each comprising inner and outer aluminum skin sheets with an insulating spacing material adhesively bonded therebetween;

along each line of intersection of a pair of side panels, an extruded aluminum tube of rectangular cross-section, the outer skins of the adjacent panels being extended substantially beyond the spacing material and being welded to each other and said tube thereby to form a substantially continuous conductive outer skin for said shelter;

in one side panel, a rectangular door opening frame comprising, along all four sides, an extrusion having a box section over which said inner and outer skins extend and to which said skins are welded;

hinged to said frame, a door comprising a door panel comprising inner and outer aluminum skins with an insulating spacer material adhesively bonded therebetween and a peripheral frame comprising, along all four sides, an extrusion having a box section over which the inner and outer skins of said door panel extend and to which said skins are welded, wherein said door opening extrusion and said door panel extrusion each include a box section which extend into a projecting lip portion, such that said door opening projecting lip portion is positioned relative to said door panel box section when said door is received into said frame, wherein said door opening projecting lip portion carries at least one peripherally mounted spring metal finger strip and said door panel box section carries at least one peripherally mounted spring metal finger strip which together provide at least two lines of conductive gasketing between said door opening frame and said door peripheral frame, when said door is received into said frame;

at least one weather gasket carried along the periphery of said door panel projecting lip portion which protects said at least one door opening projecting lip metal finger strip and said at least one door panel box section metal finger strip from ambient weather conditions when said door is received in said frame;

mounted at a plurality of spaced points around said door opening frame, a succession of locking ramps;

pivotally mounted at a plurality of spaced points around said door peripheral frame, a corresponding plurality of roller dogs adapted to engage said ramps;

link means coupling said dogs to each other in sets for coordinated operation to engage said ramps and pull said door into intimate conductive engagement with said door opening frame, compressing said spring finger strips;

a vent assembly comprising a brass honeycomb material set into a brass rim; and in one side panel, a rectangular vent frame comprising, along all four sides, an aluminum extrusion over which said inner and outer skins extend and to which said skins are welded, an annular margin of said frame being copper plated, said rim of said vent assembly being soldered to said annular margin.

* * * * *